Aug. 31, 1965 M. E. PETERSEN 3,204,128
HIGH SPEED TURNOFF GATE DRIVEN BY A GATING MEANS
Filed Sept. 23, 1963
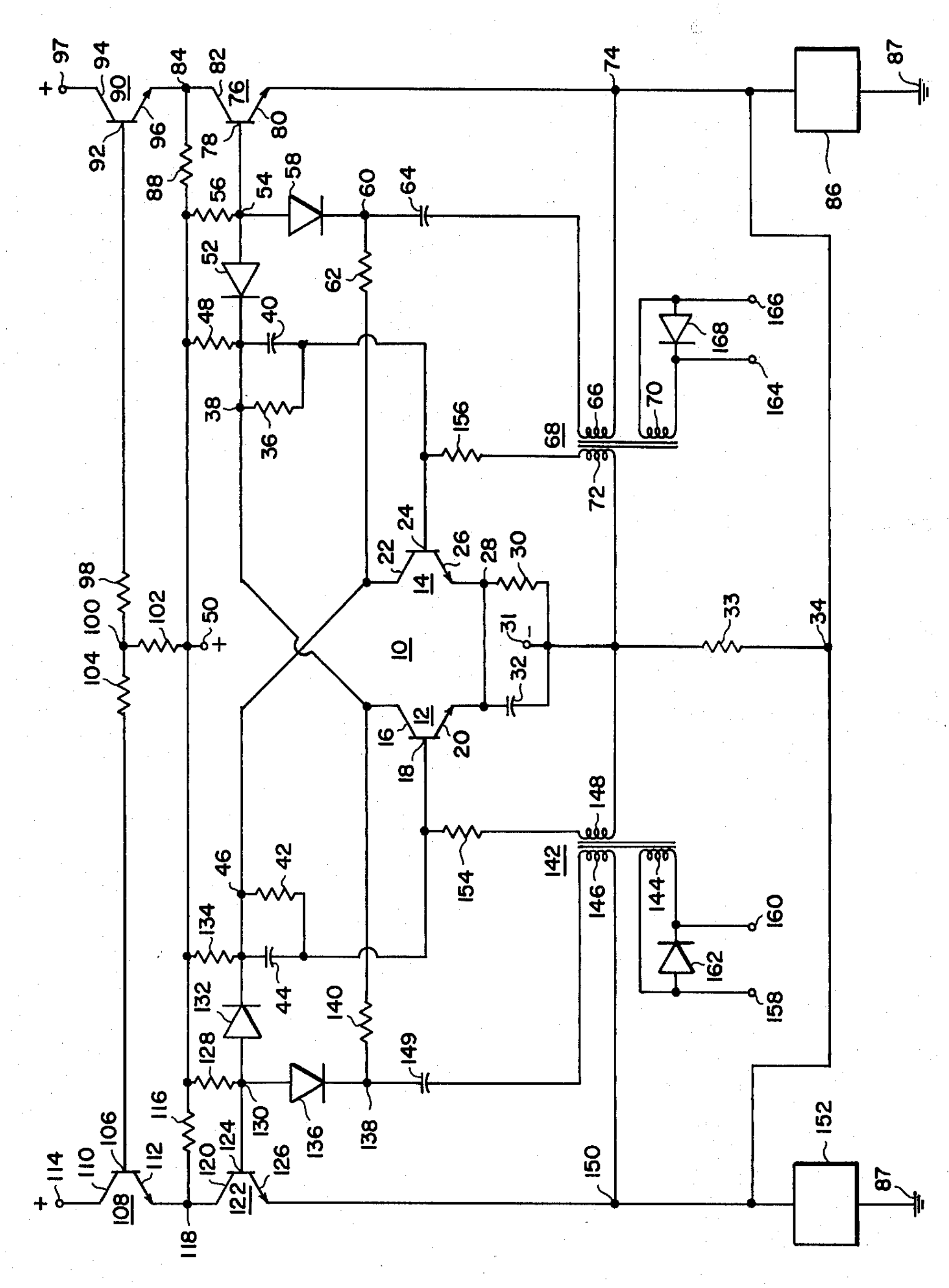
INVENTOR.
MARVIN E. PETERSEN
BY Roger W. Jensen
ATTORNEY United States Patent Office 3,204,128
Patented Aug. 31, 1965

3,204,128

HIGH SPEED TURNOFF GATE DRIVEN BY A GATING MEANS

Marvin E. Petersen, Clearwater, Fla., assignor to Honeywell Inc., a corporation of Delaware Filed Sept. 23, 1963, Ser. No. 310,583
6 Claims. (Cl. 307—88.5)

This invention pertains generally to switching apparatus and more particularly to apparatus which will provide high turnoff speed and still maintain a low leakage current through the load when the apparatus is in an OFF condition.

When present day transistors are used, it has been found that a switching circuit utilizing a fast or high speed turnoff transistor will have large amounts of leakage current therethrough. When a circuit uses a transistor having a low leakage current, it has been found that the turnoff speed is comparatively slow.

The present invention overcomes the above mentioned difficulty by connecting two transistors in series. The first transistor is a fast turnoff transistor while the second transistor although having a slow turnoff is a low leakage type. The first transistor has a signal applied to it so that it turns OFF quickly. At this time there will still be a high leakage current through the circuit. However, the voltage conditions of the first transistor in the OFF condition force the second transistor to an OFF condition. Thus the second transistor turns OFF soon after the first transistor and thereby reduces the previous high leakage current to a low leakage current. In this way the best characteristics of both transistors are combined to provide a circuit which has high speed turnoff and still maintains low leakage currents through the load when the apparatus is in an OFF condition.

As disclosed, this apparatus will apply a turnoff signal to the transistors controlling the load current and at the same time the input signal will be applied to a flip-flop circuit. The flip-flop circuit will change its state or condition and thereby operate to hold the first transistor in the new or OFF condition. The operation of this transistor, which is the fast turnoff transistor, induces switching of the second transistor to its OFF state to keep the leakage current at a low amount.

It is therefore an object of this invention to provide apparatus which will have a high turnoff speed and still permit only very low leakage currents to flow through the load.

A further object of this invention is to provide apparatus which will change the condition of a solid state switch upon immediate application of an input signal and to provide further apparatus which will hold this solid state switch in the condition after the input signal is removed.

Further objects and advantages of this invention will be apparent from a reading of the specification and appended claims in conjunction with the drawing which discloses the circuit diagram of the invention.

In the drawing a flip flop means, multivibrator means or gating circuit means generally designated as 10 contains two solid state switches, gates, valves or NPN transistors 12 and 14. Transistor 12 has a collector 16, a base 18, and an emitter 20. Transistor 14 has a collector 22, a base 24, and an emitter 26. Emitters 20 and 26 are connected together at a junction point 28. A resistor 30 is connected in parallel with a capacitor 32 between the junction point 28 and a power terminal 31. A resistor 33 is connected between a junction point 34 and the power terminal 31. A resistor 36 is connected between base 24 of transistor 14 and a junction point 38 which is further connected to collector 16 of transistor 12. A capacitor or capacitive means 40 is connected in parallel with resistor 36. A resistor 42 is connected in parallel with a capacitive means 44 between base 18 of transistor 12 and a junction point 46 which is further connected to collector 22 of transistor 14. A resistor 48 is connected between junction point 38 and a positive power terminal 50. The terminals 31 and 50 are connected to a floating power supply (not shown) and therefore are not tied directly to a ground or reference potential. It will be realized that terminal 50 is positive only in this embodiment and if different polarity type transistors or valves are used the terminal 50 may be of a negative polarity with respect to power terminal 31. The terminal 50 also supplies the bias current for some of the transistors used. A diode 52 is connected between junction point or terminal means 38 and a junction point or terminal means 54. The diode 52 is connected such that the direction of easy current flow is from junction point 54 to junction point 38. A resistor 56 is connected between junction point 54 and positive terminal 50. A diode 58 is connected between junction point 54 and a junction point or terminal means 60. A resistor 62 is connected between the junction point 60 and junction point 46. A capacitor 64 is connected between junction point 60 and one end of a first secondary winding 66 of a transformer generally designated as 68 having a primary winding 70 and a third winding or second secondary winding 72. The other end of winding 66 is connected to a junction point 74. A valve means, switching means, gate means, current control means or NPN transistor means generally designated as 76 has a base 78, connected to junction point 54, and an emitter 80 connected to junction point 74 and a collector 82 connected to a junction point 84. A load 86 is connected between junction point 74 and a reference potential or ground 87. A resistor 88 is connected between junction point 84 and positive terminal 50. An NPN transistor means, switching means, gate means, current control means or valve means 90 has a base 92 and a collector 94, and an emitter 96. Emitter 96 is connected to junction point 84. The collector 94 is shown as connected to a positive terminal 97 which supplies power to the load 86. A resistor 98 is connected between a junction point 100 and base 92 of transistor 90. A resistor 102 is connected between positive terminal 50 and junction point 100. A resistor 104 is connected between the junction point 100 and a base 106 of a gate means, valve means, switching means, current control means or NPN transistor means 108 having a collector 110 and an emitter 112. Collector 110 is connected to a positive terminal 114 which may be the same as terminal 97 or may be different depending upon the application. A resistor 116 is connected between positive terminal 50 and a junction point 118. Junction point 118 is connected to emitter 112 of transistor 108 and a collector 120 of an NPN transistor, switching means, gate means, current control means or valve means 122 having a base 124 and an emitter 126. A resistor 128 is connected between positive terminal 50 and a junction point 130 which is further connected to base 124 of transistor 122. A diode means or rectifier means 132 is connected between the junction point or terminal means 46 and the junction point or terminal means 130 in a manner whereby the direction of easy current flow is from junction point 130 to junction point 46. A resistor 134 is connected between junction point 46 and positive terminal 50. A diode means or rectifier means 136 is connected between junction point 130 and a junction point or terminal means 138 in a manner whereby the direction of easy current flow is from junction point 130 to junction point 138. A resistor 140 is connected between junction point 138 and junction point 38. A transformer generally designated as 142 has a primary winding 144 and a first secondary winding 146 along with a third winding or second secondary winding 148. A capacitor 149 is connected between junction point 138 and one end of winding 146. The other end of winding 146 is connected to a junction point 150 which is further connected to emitter 126 of transistor 122, to junction point 34 and to junction point 74. A load 152 is connected between ground 87 and the junction point 150. A resistor 154 is connected between the base 18 of transistor 12 and one end of the third winding 148. The other end of winding 148 is connected to power terminal 31 and to one end of the third winding 72 of transformer 68. A resistor 156 is connected between the other end of the third winding 72 and the base 24 of transistor 14. Input terminals 158 and 160 are connected to the two ends of primary winding 144. A diode or rectifier means 162 is connected between the input terminals 158 and 160 in a direction whereby current readily flows from terminal 158 through diode 162 to terminal 160. Terminals 164 and 166 are connected to the two ends of primary winding 70 which has a diode means or rectifier means 168 connected in parallel therewith. The diode means 168 is connected to allow a direction of easy current flow from input terminal 166 to terminal 164.

For the purpose of explanation, it may be assumed that transistor 12 of flip-flop 10 is in an ON condition when the apparatus has power applied thereto. In this specification the OFF or nonconductive condition of a transistor means that there are only leakage currents flowing therethrough. The ON or conductive condition is when there is substantially more current flow than can be attributed to leakage. A transistor in an ON condition need not however be in a saturated or "full" ON condition to be ON within the meaning of this specification. With transistor 12 in an ON condition the junction point 38 is near the voltage of power terminal 31. This keeps the base 24 of transistor 14 near the potential of power terminal 31 and therefore transistor 14 is in an OFF condition. The low voltage at junction point 38 also brings the base 78 of transistor 76 to a low voltage condition which is only slightly higher than the voltage of junction point 38 and thereby keeps transistor 76 in an OFF condition. Depending upon whether the diode 52 is germanium or silicon or some other material, the voltage at base 78, due to voltage drop through diode 52, will be approximately one-fourth volt to one volt higher than junction point 38. If transistor 76 is in an OFF condition, the collector 82 will be at a voltage near that of positive terminal 50 since there will be no voltage drop in resistor 88. Therefore, base 92 and emitter 96 of transistor 90 will be approximately the same voltage and transistor 90 will be in an OFF condition. It was previously stated that transistor 14 was in an OFF condition therefore the collector 22 and accordingly the junction point 46 will be at a high voltage condition. This condition allows current to flow from positive terminal 50 through resistor 128 to turn transistor 122 to an ON condition. Since transistor 122 is ON, the collector 120 is placed at a potential which is near that of junction point 150 and, assuming resistor 33 is a low resistance, is quite near the potential of power terminal 31. This means that emitter 112 of transistor 108 is at a lower potential than is base 106 and accordingly current can flow from positive terminal 50 through resistor 104 to turn transistor 108 to an ON condition and allow current flow from terminal 114 through transistors 108 and 122, through load 152, to ground 34. Transistors 76 and 122 have a fast turnoff oharacteristic but a high leakage characteristic while transistors 90 and 108 have a comparatively slower turnoff characteristic but have very low leakage. In present transistor technologies, in order to obtain a transistor which has a fast turnoff time, certain impurities must be added to the semiconductor material which as a result increase the leakage current. The method by which low leakage current in a transistor is obtained increases the internal capacitance in the transistor and this increased capacitance prevents the transistor from turning OFF as fast as if the capacitance were low.

It may now be assumed that a pulse is applied between terminals 158 and 160. This pulse will be characterized by making terminal 158 negative with respect to terminal 160. Opposite polarity pulses would be shunted by diode 162 and have no effect on the circuit. This input pulse is transmitted to the windings 146 and 148. The negative pulse will place base 124 of transistor 122 at a negative potential with respect to emitter 126. This happens because the end of the winding 146 which is connected to capacitor 149 suddenly reduces the potential at junction point 138. This diverts current flowing into base 124 to flow through diode 136 to charge up capacitor 149. The absence of current flow into transistor 122 along with the reduction in voltage at junction point 130 turns transistor 122 to an OFF condition. The turnoff of transistor 122 raises the potential at junction point 118 to a potential which is higher than the base 106 of transistor 108 and accordingly turns transistor 108 to an OFF condition. It will be realized that this pulse through the transformer 142 will only be of a finite duration and cannot hold transistor 122 in an OFF condition. This negative pulse is also applied to flip-flop 10 to place base 18 of transistor 12 at a negative potential with respect to power terminal 31. This turns transistor 12 to an OFF condition which through the capacitor 40 turns transistor 114 to an ON condition. With transistor 14 turned to an ON condition and its collector 22 lowered in potential, the base 124 of transistor 122 is held in a low potential to keep the base 124 of transistor 122 negative with respect to emitter 126 and thereby keep this transistor in an OFF condition. If a further negative pulse is received by transformer 142 there will be no resulting action. However, if a negative pulse is received by transformer 68 the flip-flop circuit will return to the originally assumed conditions and transistors 76 and 90 will again turn to the OFF condition.

While it was not specifically stated before, the transistors 76 and 90 will turn to an ON condition when transistor 12 turns to an OFF condition due to the fact that the potential at junction point 38 is no longer low enough to keep the base 78 of transistor 76 at a potential which is negative with respect to emitter 80. These voltage conditions allow current flow from positive terminal 50 through resistor 56 to base 78 to turn transistor 76 to an ON condition. The action of transistor 76 turning to an ON condition will thereby turn transistor 90 to an ON condition.

As will be realized by those skilled in the art, the components shown are not the only components which can be used to actuate the series connected transistors. Further, it is not necessary that the load such as 86 be connected between the series transistors and ground but rather it could be placed between the positive power terminal and the series transistors if this is desired. However, appropriate changes in voltage supplies may be required. Further, it is not necessary that two sets of series connected switches be used or that they be used in conjunction with the set of diodes utilized to provide immediate turnoff upon application of an input pulse. The two transistors which are series connected can be used without the windings 66 and 146 for merely providing a sharp square wave change in current levels and low leakage without regard for having the change occur at exactly the same time as the input pulse is applied to the gating apparatus.

I therefore do not wish to be limited by the terms in the specification or by the one embodiment shown in the drawing but only by the appended claims.

What is claimed is:

1. In apparatus utilizing solid state switches for providing high speed turnoff of current to a load while maintaining low leakage current through the load when the apparatus is in an OFF condition comprising, in combination:

first transistor means including base, emitter and collector means;

second transistor means including base, emitter and collector means, said first transistor means being of a different type from said second transistor means, said first transistor means having a low leakage current as compared to said second transistor means, and said second transistor means having a lower internal capacitance than said first transistor means and therefore being adapted to turn OFF faster than said first transistor means;

current source means including first and second terminal means;

load means;

means connecting the collector means and emitter means of said first and second transistors in series with each other and in series with said load means between said first and second terminal means of said current source means;

flip-flop means including first and second control means, first and second output means and power input means;

biasing means connected to said first and second transistor means and to said power input means of said flip-flop means, said first and second transistor means being biased so that immediately after said second transistor means changes from a first state of conductivity to a second state, the first transistor means changes from the first state of conductivity to the second state;

first and second diode means each including first and second terminal means, said first terminal means of each of said diode means being connected to said base means of said second transistor means;

transformer means including primary winding means and first and second secondary winding means, said primary winding means being connected for receiving input signal pulses;

means connecting said first secondary winding to said first output means of said flip-flop means and also connecting said first secondary winding between said second terminal means of said first diode means and said emitter means of said second transistor means for applying signal pulses thereto, a signal pulse between said base and emitter means of said second transistor means changing said second transistor means from a conductive state to a nonconductive state;

means connecting said second secondary winding to said first control means of said flip-flop means;

means connecting said first output means of said flip-flop means to said second terminal means of said first diode means, said flip-flop means being adapted for providing a first output signal at said first output means after receipt of the signal pulse from said transformer means, the first output signal being for holding said second transistor means in the nonconductive state;

means connecting said second output means of said flip-flop means to said second terminal means of said second diode means; and triggering means connected to said second control means of said flip-flop means for applying a control signal thereto, said flip-flop means being adapted for providing a second output signal at said second output means to change said second transistor means from the nonconductive to the conductive state upon receipt of the control signal from said triggering means.

2. In apparatus utilizing electronic switches for providing high speed turnoff of current to a load while maintaining low leakage current through the load when the apparatus is in an OFF condition comprising, in combination:

first valve means including control, common and output means;

second valve means including control, common and output means, said first valve means being of a different type from said second valve means, said first valve means being characterized by having a low leakage current as compared to said second valve means, and said second valve means being characterized by having a faster turnoff than said first valve means;

current source means including first and second terminal means;

load means;

means connecting the output means and common means of said first and second valve means in series with said load means between said first and second terminal means of said current source means;

gating means including first and second control means and first and second output means;

biasing means connected for biasing said first and second valve means and for biasing said gating means, said first and second valve means being biased so that immediately after said second valve means changes from a first state of conductivity to a second state, the first valve means changes from the first state of conductivity to the second state;

first and second diode means each including first and second terminal means, said first terminal means of each of said diode means being connected to said control means of said second valve means;

transformer means including primary winding means and first and second secondary winding means, said primary winding means being connected for receiving input signal pulses;

means connecting said first secondary winding between said second terminal means of said first diode means and said common means of said second valve means for applying signal pulses thereto, a signal pulse between said control and common means of said second valve means changing said second valve means from a conductive state to a nonconductive state;

means connecting said second secondary winding to said first control means of said gating means;

means connecting said first output means of said gating means to the second terminal means of said first diode means, said gating means being adapted for providing a first output signal at said first output means after receipt of the signal pulse from said transformer means to hold said second valve means in the nonconductive state;

means connecting said second output means of said gating means to said second terminal means of said second diode means; and triggering means connected to said second control means of said gating means for applying a control signal thereto, said gating means being adapted for providing a second output signal at said second output means to change said second valve means from the nonconductive to the conductive state upon receipt of the control signal from said triggering means.

3. In apparatus utilizing electronic switches for providing high speed turnoff of current to a load while maintaining low leakage current through the load when the apparatus is in an OFF condition comprising, in combination:

first valve means including control, common and output means;

second valve means including control, common and output means, said first valve means being of a different type from said second valve means, said first valve means being characterized by having a low leakage current as compared to said second valve means, and said second valve means being characterized by having a faster turnoff than said first valve means;

current source means including first and second terminal means;

load means;

means connecting the output means and common means of said first and second valve means in series with said load means between said first and second terminal means of said current source means;

gating means including first and second control means and first and second output means;

biasing means connected for biasing said first and second valve means, said first and second valve means being biased so that immediately after said second valve means changes from a first state of conductivity to a second state, the first valve means changes from the first state of conductivity to the second state;

signal directing means each including first and second terminal means, said first terminal means of each of said signal directing means being connected to said control means of said second valve means;

signal conversion means including input means and first and second output winding means, said input winding means being connected for receiving input signal pulses;

means connecting said first output means of said signal conversion means between said second terminal means of said signal directing means and said common means of said second valve means for applying signal pulses thereto, a signal pulse between said control and common means of said second valve means changing said second valve means from a conductive state to a nonconductive state;

means connecting said second output means of said signal conversion means to said first control means of said gating means;

means connecting said second output means of said gating means to said second terminal means of said signal directing means, said gating means being adapted for providing a first output signal at said output means after receipt of the signal pulse from said signal converting means to hold said second valve means in the conductive state; and means connecting said gating means to said control means of said second valve means for applying a second control signal thereto, said second control signal changing said second valve means from the nonconductive to the conductive state upon receipt of the second control signal.

4. In apparatus utilizing electronic switches for providing high speed turnoff of current to a load while maintaining low leakage current through the load when the apparatus is in an OFF condition comprising, in combination:

first valve means including control, common, and output means;

second valve means including control, common, and output means, said first valve means being of a different type from said second valve means, said first valve means being characterized by having a low leakage current as compared to said second valve means, and said second valve means being characterized by having a faster turnoff than said first valve means;

current source means including first and second terminal means;

load means;

means connecting the output means and common means of said first and second valve means in series with said load means between said first and second terminal means of said current source means;

gating means including output means connected for supplying a control signal to said control means of said second valve means to change said second valve means from a first state of conductivity to a second state of conductivity; and biasing means connected to said control electrodes of said first and second valve means for biasing said first and second valve means, said first and second valve means being biased so that immediately after said second valve means changes from the first state of conductivity to the second state, the first valve means changes from the first state of conductivity to the second state.

5. In apparatus for providing high speed turnoff of current through a load comprising, in combination:

transistor means including base, emitter and collector means;

current source means including first and second terminal means;

load means;

means connecting the collector means and emitter means of said transistor means in series with said load means between said first and second terminal means of said current source means;

flip-flop means including first and second control means, first and second output means and power input means;

biasing means connected to said transistor means and to said power input means of said flip-flop means;

first and second diode means each including first and second terminal means, said first terminal means of each of said diode means being connected to said base means of said transistor means;

transformer means including primary winding means and first and second secondary winding means, said primary winding means being connected for receiving input signal pulses;

means connecting said first secondary winding between said second terminal means of said first diode means and said emitter means of said transistor means for applying signal pulses thereto, a signal pulse between said base and emitter means of said transistor means changing said transistor means from a conductive state to a nonconductive state;

means connecting said second secondary winding to said first control means of said flip-flop means;

means connecting said first output means of said flip-flop means to said second terminal means of said first diode means, said flip-flop means being adapted for providing a first output signal at said first output means after receipt of the signal pulse from said transformer means to hold said transistor means in the nonconductive state;

means connecting said second output means of said flip-flop means to said second terminal means of said second diode means; and triggering means connected to said second control means of said flip-flop means for applying a control signal thereto, said flip-flop means being adapted for providing a second output signal at said second output means to change said transistor means from the nonconductive to the conductive state upon receipt of the control signal from said triggering means.

6. In apparatus for providing high speed turnoff of current through a load comprising, in combination:

valve means including control, common and output means;

power source means including first and second terminal means;

load means;

means connecting the output means and common means of said valve means in series with said load means between said first and second terminal means of said power source means;

gating means including control means and output means;

diode means including first and second terminal means, said first terminal means of said diode means being connected to said control means of said valve means;

signal converting means including input means and output means, said input means being connected for receiving input signal pulses;

means connecting said output means of said signal converting means to said second terminal means of said diode means for applying signal pulses thereto, a signal pulse at said control means of said valve means changing said valve means from a conductive state to a nonconductive state;

means further connecting said output means of said signal converting means to said input means of said gating means;

means connecting said output means of said gating means to said second terminal means of said diode means, said gating means being adapted for providing a first output control signal at said output means after receipt of the signal pulse from said signal converting means to hold said valve means in the nonconductive state; and means connecting said gating means to said control means of said valve means for applying a second output control signal thereto, said second control signal changing said valve means from the nonconductive to the conductive state upon receipt of the second output control signal.

References Cited by the Examiner

UNITED STATES PATENTS

| | | | |
|---|---|---|---|
| 2,888,579 | 5/59 | Wanlass | 307—88.5 |
| 2,946,898 | 7/60 | Jensen | 307—88.5 |

ARTHUR GAUSS, *Primary Examiner.*